United States Patent [19]

Baron et al.

[11] Patent Number: 4,852,061

[45] Date of Patent: Jul. 25, 1989

[54] HIGH DENSITY, HIGH PERFORMANCE REGISTER FILE HAVING IMPROVED CLOCKING MEANS

[75] Inventors: Henry C. Baron, Manassas; Johnny J. LeBlanc, McLean; Thomas M. Storey, Great Falls; Joseph W. Yoder, Fairfax, all of Va.

[73] Assignee: International Business Machines Corporation, Armonk, N.Y.

[21] Appl. No.: 313,300

[22] Filed: Feb. 21, 1989

Related U.S. Application Data

[63] Continuation of Ser. No. 44,167, Apr. 30, 1987, abandoned.

[51] Int. Cl.[4] .................. G11C 11/00; G11C 7/00; G11C 8/00; G11C 29/00
[52] U.S. Cl. ........................ 365/154; 365/189.02; 365/189.05; 365/230.06; 365/190; 365/201; 365/233; 371/21; 307/481
[58] Field of Search ............. 365/154, 189.01, 189.02, 365/189.05, 194, 190, 201, 230.01, 230.02, 230.06, 233; 371/10, 21; 307/468, 481

[56] References Cited

U.S. PATENT DOCUMENTS

| | | | |
|---|---|---|---|
| 4,491,937 | 1/1985 | Chan | 365/154 |
| 4,627,032 | 12/1986 | Kolwicz et al. | 365/233 |
| 4,665,508 | 5/1987 | Chang | 365/190 |
| 4,685,088 | 8/1987 | Iannucci | 365/194 |

Primary Examiner—Stuart N. Hecker
Assistant Examiner—Melissa J. Koval
Attorney, Agent, or Firm—John E. Hoel

[57] ABSTRACT

The improved register file includes an array of storage cells arranged in columns and rows, each column having a pair of bit lines for writing into the cell. Each storage cell includes a flip-flop cell having a first storage node connected to a respective read line which is unique for that cell. A read address latch has an enabling input connected to the master clock signal which is the same master clock signal for the LSSD logic on the integrated circuit chip. The read address latch applies its decoded output to a multiplexer which selects those read lines coming from one of the rows of storage cells in the array, and applies those selected read lines to an output storage cell array. The output storage cell array is enabled by a slave clock signal which is the same slave clock signal employed in the LSSD logic on the same integrated circuit chip. The output storage cell array stores the data from the selected read lines out of the multiplexer. The multiplexer propagates the data signals output from the read lines and performs the selection during the delay period between the master clock signal and the slave clock signal. Thus, the circuit makes use of the dead time between the master clock signal and the slave clock signal which was heretofore wasted, in performing the selection of the read lines for latching in the output storage cell array. The feature of connecting separate read lines to each respective storage cell in the array allows the independent accessing of different register rows in the register file for reading and writing, during the same logic cycle defined by the interval for the occurrence of both the master and the slave clock pulses.

4 Claims, 9 Drawing Sheets

FIG. 1.

FIG. 2.
REGISTER FILE

FIG. 3.
WRITE ADDRESS LOGIC 22

READ ADDRESS LOGIC 24

FIG. 5.

FIG. 6.
OUTPUT LOGIC 42

FIG. 7.
TRUTH TABLE

|  | MC1 | MC2 | SC1 | SC2 |
|---|---|---|---|---|
| BYPASS MODE | ON | OFF | OFF | ON |
| SCAN MODE | OFF | ON | OFF | ON |
| ARRAY MODE | OFF | OFF | ON | OFF |

HIGH DENSITY, HIGH PERFORMANCE REGISTER FILE HAVING IMPROVED CLOCKING MEANS

This is a continuation of U.S. Pat. Ser. No. 044,167, filed Apr. 30, 1987, now abandoned.

BACKGROUND OF THE INVENTION

1. Technical Field

The invention disclosed broadly relates to semiconductor logic circuits and more particularly relates to an improved register file circuit.

2. Background Art

In modern complex logic function design, such as in the design of microprocessors, a plurality of registers need to be rapidly accessed, each register being able to store a byte or word of data. These registers must be accessed at speeds which are no slower than the logic speeds of other combinatorial logic circuits in the complex logic function. Typical applications such as microprocessors require as many as 16 fast access registers for storing operands, addresses, status words, etc. It is desirable to design the plurality of registers in a contiguous block to enhance both density and performance characteristics. Such a contiguous block of registers is referred to generally as a register file. A typical application of a register file is in the prefetching and storage of a plurality of instructions which are then sequentially read out from consecutive ones of the registers in the register file.

In order to test the circuits in complex logic functions on an integrated circuit chip, the technique of level sensitive scan design (LSSD) is required. In its most elementary form, level sensitive scan design principles involve the use of a dedicated serial data path from an input pad to the serial inputs of concatenated LSSD shift registers for the purpose of scanning in test data which is then output during a testing interval to embedded logic on the integrated circuit chip to be tested. During the testing interval, the embedded logic processes the test data input from the LSSD scan string and outputs the result of that logical processing to an output LSSD shift register associated with the embedded logic. That output LSSD shift register then serially outputs the test result data to the same or to another LSSD scan string, which result data is serially output from the chip for test result analysis These principles are described in greater detail in the following related patents:

U.S. Pat. No. 3,761,695 entitled "Method of Level Sensitive Testing a Functional Logic System," to Edward B. Eichelberger and of common assignee; U.S. Pat. No. 3,783,254 entitled "Level Sensitive Logic System," to Edward B. Eichelberger and of common assignee; U.S. Pat. No. 3,806,891 entitled "Logic Circuit for Scan-In/Scan-Out," to Edward B. Eichelberger, et al. and of common assignee; and U.S. Pat. No. 4,071,902 entitled "Reduced Overhead for Clock Testing in a Level System Scan Design (LSD) System," to Edward B. Eichelberger, et al. and assigned to the common assignee.

Prior art approaches to designing register files on the same integrated circuit chip with the balance of the combinatorial logic in a microprocessor, for example, employ random access memory (RAM) technology. Typically, a small RAM array will be embodied on the same integrated circuit chip with the balance of the microprocessor circuitry. Typical RAM circuitry has an array of storage cells arranged in rows and columns, each column of storage cells being connected to a pair of bit lines. The bit lines in the RAM configuration are used for both writing data into the respective storage cells and reading data out of the respective storage cells. The clocking arrangement for the RAM configuration is a single clock. Complex logic functions which are embodied in level sensitive scan design (LSSD) technology, require two non-overlapping clocks. Therefore, when a RAM file is embodied on a complex logic function circuit chip employing LSSD technology, the RAM clock must be selected from either the master clock or the slave clock used in the LSSD logic on the balance of the chip. The master clock signal cannot be chosen because the outputs from the RAM file must feed into master latches which would create a race condition violating LSSD design rules. Thus, the slave clock pulse must be chosen as the clock pulse for a RAM file on an integrated circuit chip using LSSD technology. Logic designers can place an artificial delay, for example, in a master clock pulse to delay it sufficiently to enable its use as the RAM clock pulse or alternately logic designers can make use of the slave clock pulse as the RAM clock pulse, but the logic designer does not have the ability to produce more than one clock pulse during a logic cycle for the purpose of clocking the RAM file. Thus the RAM file can either be written into during a logic cycle or read from during a logic cycle, but it cannot be both written into and read from during the same logic cycle.

Since such great dependence is placed upon fast accessing for reading a first address register and writing a second address register in a RAM file for high speed arithmetic and logical operations in microprocessor applications, for example, it is imperative that a register file be capable of both being written into and being read from at differently addressed registers during the same logic cycle for the complex logical function embodied on the same integrated circuit chip. This has not been satisfactorily available in the prior art.

OBJECTS OF THE INVENTION

It is therefore an object of the invention to provide an improved register file for embodiment on a complex logic function integrated circuit chip.

It is another object of the invention to provide an improved register file which is capable of being written into and read from at different addressed registers during the same logic cycle, in an improved manner.

It is a further object of the invention to provide an improved register file which can be embedded within complex logic functions on an integrated circuit chip and which can be tested with LSSD techniques.

It is still a further object of the invention to provide an improved register file which includes preprogrammed binary bit states to enable power-on reset to a predetermined state.

SUMMARY OF THE INVENTION

These and other objects, features and advantages of the invention are accomplished by the high density, high performance register file disclosed herein. The improved register file includes an array of storage cells arranged in columns and rows, each column having a pair of bit lines for writing into the cell. Each storage cell includes a flip-flop cell having a first storage node connected to a respective read line which is unique for that cell. A read address latch has an enabling input connected to the master clock signal which is the same master clock signal for the LSSD logic on the integrated circuit chip. The read address latch applies its decoded output to a multiplexer which selects those read lines coming from one of the rows of storage cells in the array, and applies those selected read lines to an output storage cell array. The output storage cell array is enabled by a slave clock signal which is the same slave clock signal employed in the LSSD logic on the same integrated circuit chip. The output storage cell array stores the data from the selected read lines out of the multiplexer. The multiplexer propagates the data signals output from the read lines and performs the selection during the delay period between the master clock signal and the slave clock signal. Thus, the circuit makes use of the dead time between the master clock signal and the slave clock signal which was heretofore wasted, in performing the selection of the read lines for latching in the output storage cell array. The feature of connecting separate read lines to each respective storage cell in the array allows the independent accessing of different register rows in the register file for reading and writing, during the same logic cycle defined by the interval for the occurrence of both the master and the slave clock pulses.

Additional features of the invention include LSSD testability, the ability to initialize the storage cells in the array to a predetermined logic state asynchronously and the feature of bypassing the storage cell array and allowing the logic states of the bit lines for the array to be latched in the output storage cell array using an LSSD master and slave latch pair, thereby preserving proper logic timing for the complex logic functions connected to the register file.

BRIEF DESCRIPTION OF THE DRAWINGS

These and other objects, features and advantages of the invention will be more fully appreciated with reference to the accompanying figures.

DESCRIPTION OF THE BEST MODE FOR CARRYING OUT THE INVENTION

Figure 1:
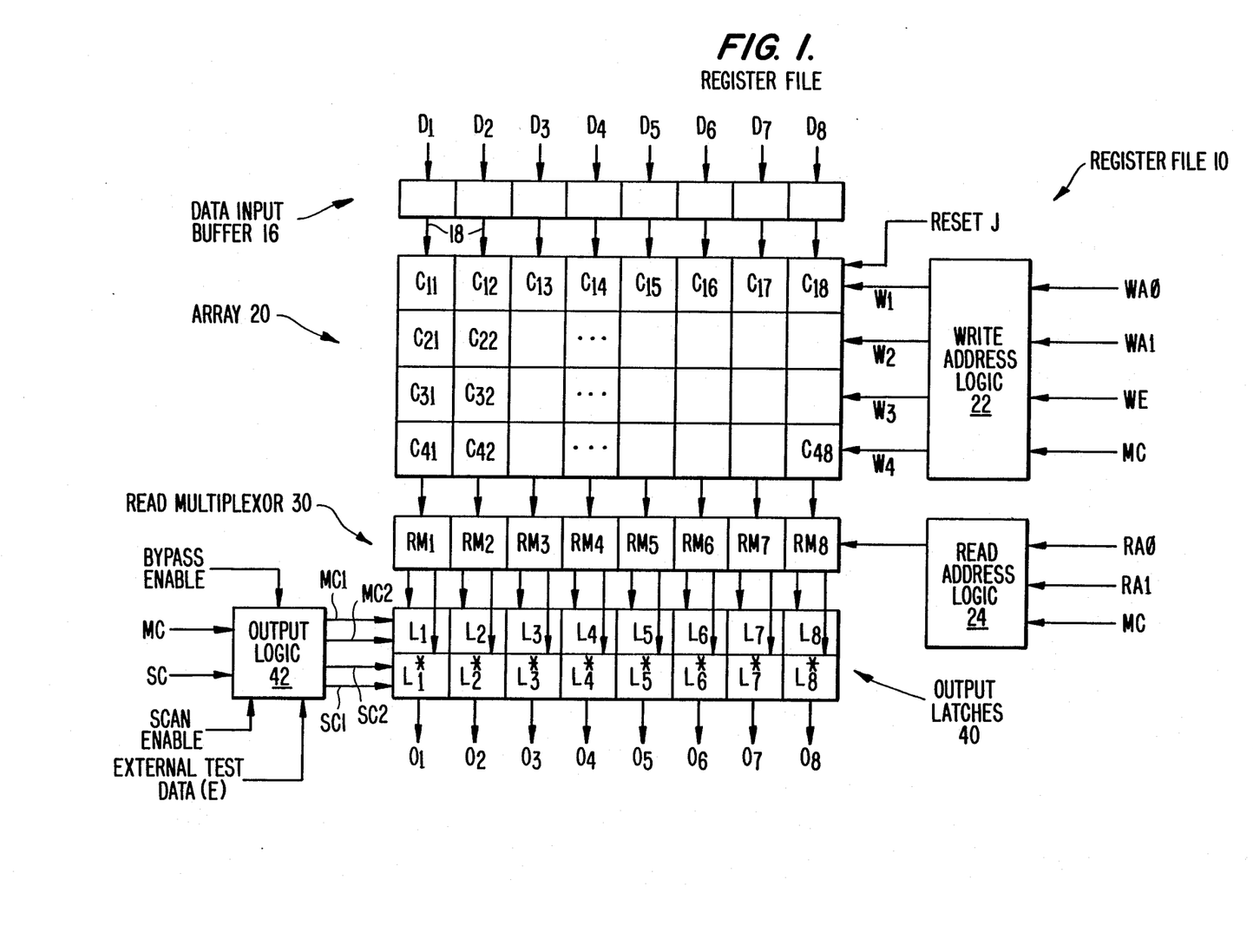
FIG. 1 is a logic block diagram of the register file 10.

The register file 10 is shown in a block diagram in FIG. 1, and consists of a data input buffer 16 which is connected by the data lines 18 to the register file array 20. The register file array 20 has its respective registers addressed by the write address logic 22 The register file array 20 is an array of storage cells arranged in rows corresponding to registers, and columns. Each storage cell in the register file array 20 includes a read output line which serves as the output from the register file array 20. The read output lines are input to the read multiplexer 30 and those read lines corresponding to one of the selected register rows in the register file array 20, are selected by the read address latch 24. The selected read lines have their signals propagated through the multiplexer 30 and applied to the output latches 40. The output latches 40 consist of a plurality of level sensitive scan design latch pairs consisting of a master latch and a slave latch.

Figure 2:
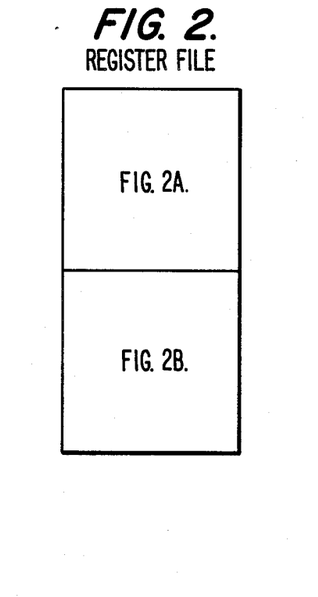
FIG. 2 is a more detailed schematic circuit diagram of the register file invention, and is divided into two components, FIGS. 2A and 2B.
Figure 2A:
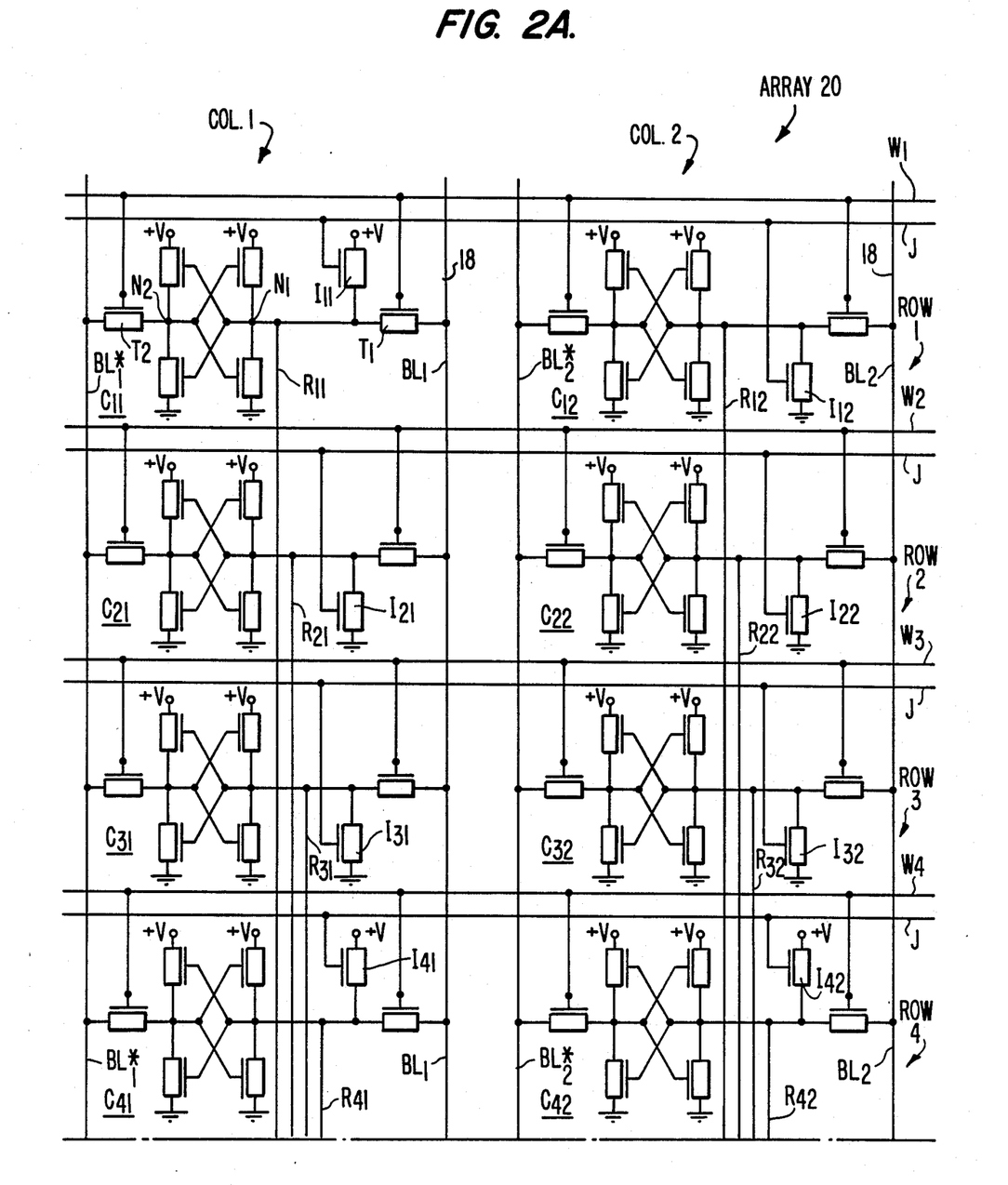
Figure 2B:
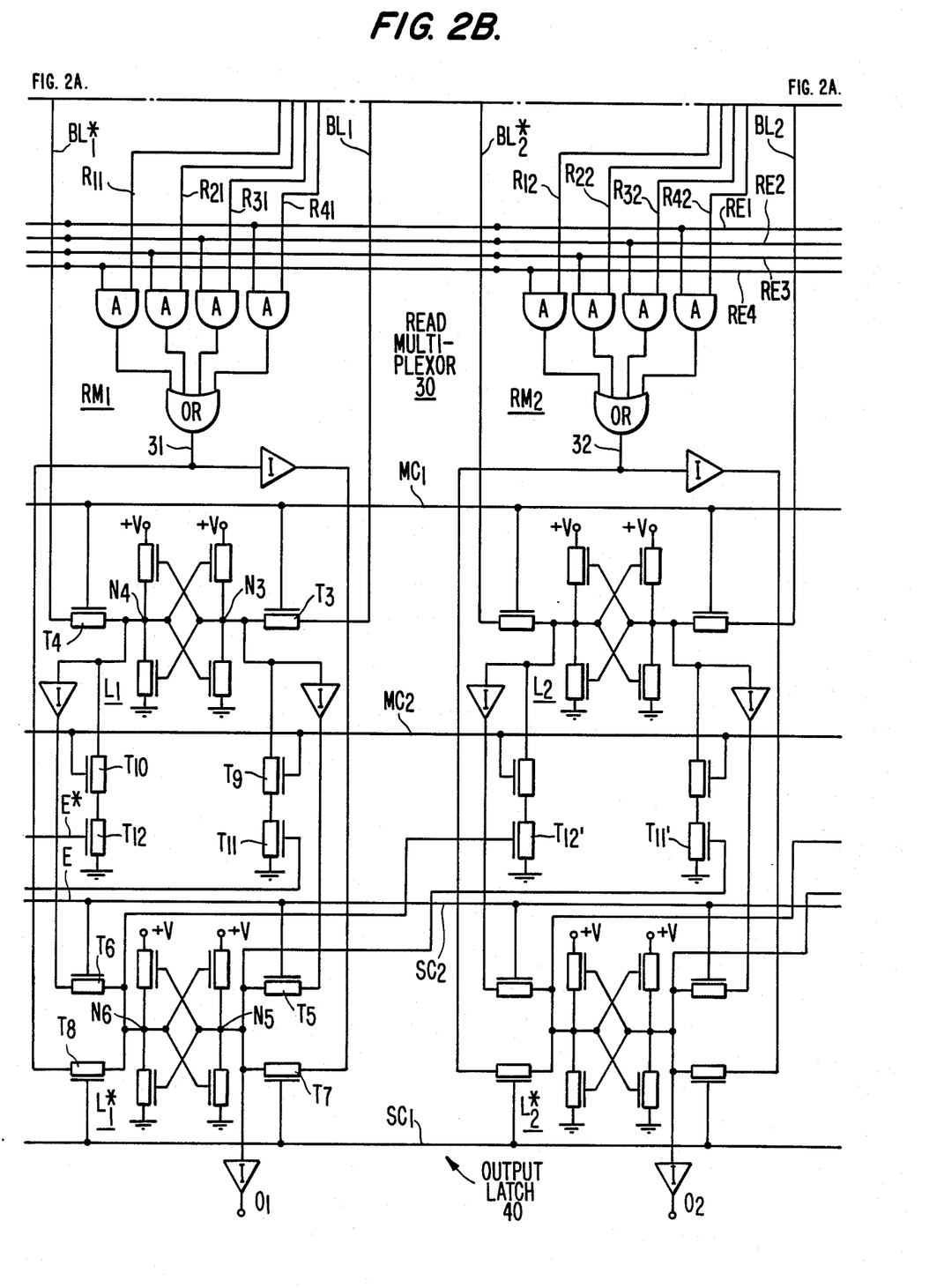

FIG. 2 shows the register file invention. The array 20 is represented in FIG. 2 by eight flip-flop storage cells arranged in column 1 and column 2 and in rows 1, 2, 3 and 4. The storage cells are identified by the reference $C_{ij}$ where i and j represent the row and column number in conventional matrix notation. For example, the flip-flop storage cell $C_{11}$ represents the storage cell in row 1, column 1. Each of the flip-flop storage cells in the array 20 is identical (except for the reset device $I_{ij}$, to be discussed later) and therefore the structure of the storage cell $C_{11}$ will be described and will represent the structure of all of the storage cells in the array 20. The flip-flop storage cell $C_{11}$ in FIG. 2 is depicted as a complementary MOS (CMOS) flip-flop having two storage nodes N1 and N2, the first node N1 connected through a first transfer gate T1 to the true bit line BL1 and a second node N2 connected through the second transfer gate T2 to the complementary bit line BL1*. The first and second transfer gates T1 and T2 have their control electrodes connected to the write signal line W1. The true and complement bit lines BL1 and BL1* in column 1 are connected through a respective one of a plurality of input data lines 18 from the input data buffer 16. Typically, the bit lines BL1 and BL1* re driven in complementary fashion in a manner well-known to the art.

One characteristic of the invention is the connection of a separate, unique read line $R_{ij}$ to each respective storage cell $C_{ij}$ in the array 20, such as line R11 connected to C11 as is shown in FIG. 2.

Figure 3:
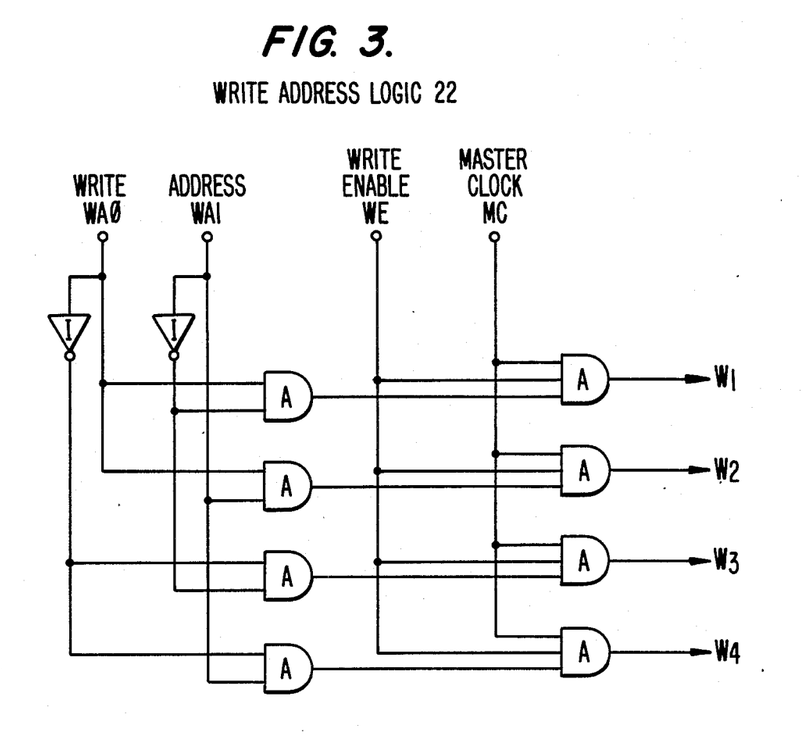
FIG. 3 is a detailed logic diagram of the write decoder 22.

FIG. 3 shows the logic diagram of the write address logic 22 whose write signal outputs W1, W2, W3 and W4 are applied to the control electrodes of the transfer gates T1 and T2 for each storage cell in the array 20 of FIG. 2. The write logic 22 of FIG. 3, has an input connected to the master clock signal MC and it has, in this example, two binary write address input lines WA0 and WA1 which will enable the selection of one out of four of the register rows 1, 2, 3 or 4 in the array 20 of FIG. 2, for the purpose of writing in the binary state represented by the bit lines 18.

Figure 4:
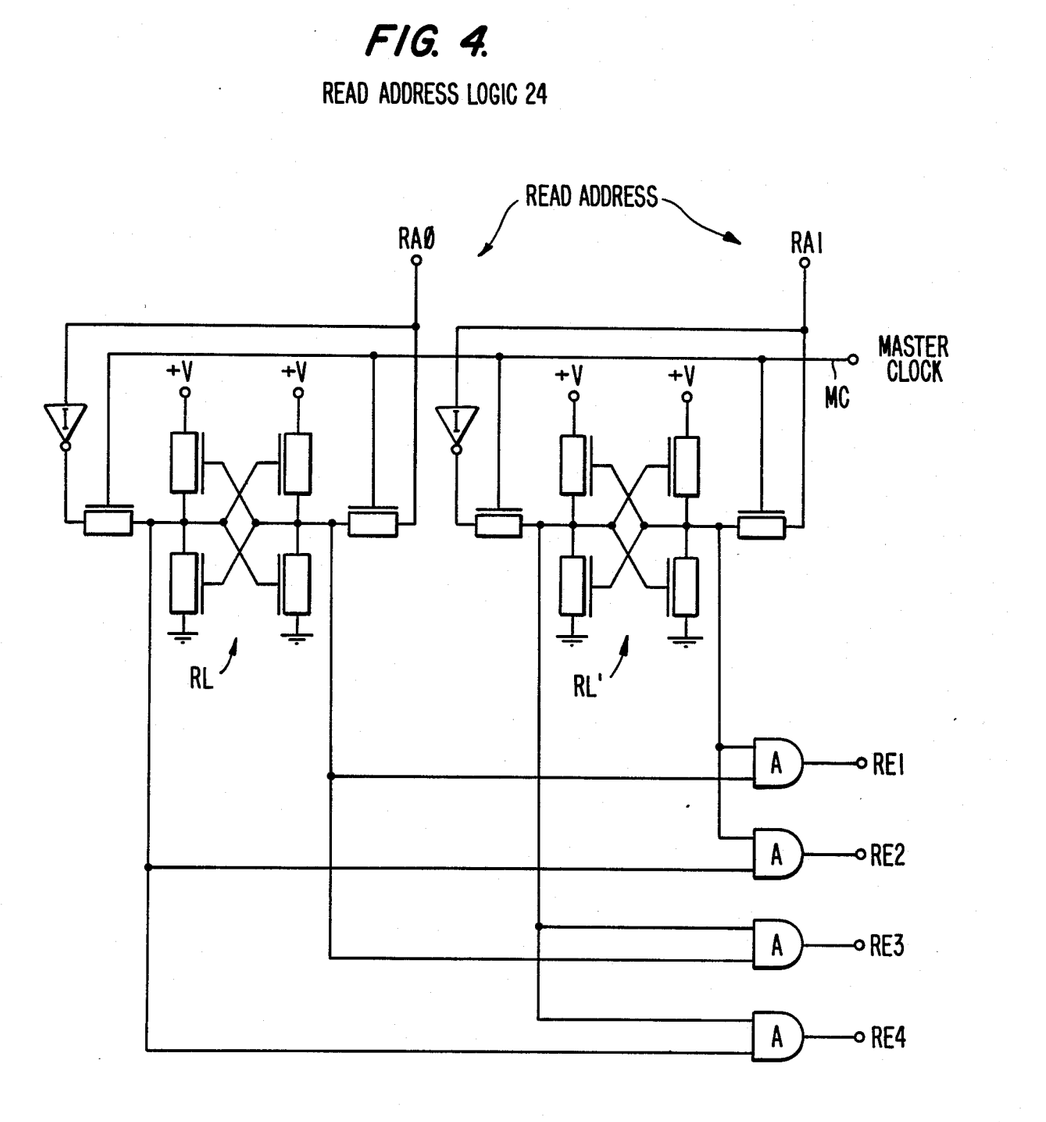
FIG. 4 is a detailed logic diagram of the read address latch 24.

The read address logic 24 is shown in the logic diagram of FIG. 4. The read address logic 24 produces the read line select signals RE1, RE2, RE3 and RE4 which are applied to the read multiplexer 30, as is shown in FIG. 2. The read address logic 24 has an input connected to the master clock signal MC as is shown in FIG. 4, to enable the latching of the binary state of the read address lines RA0 and RA1 by the latches RL and RL', thereby selecting one out of the four read line select signals RE1, RE2, RE3 or RE4.

The read multiplexer 30 shown in FIG. 2 has a combinatorial logic block RM1 associated with column 1, RM2 associated with column 2, etc. as is shown in FIG. 2. Each respective read line R11, etc. from each respective storage cell C11, etc. in each respective column, column 1, etc. is connected to a corresponding AND gate of the RM1 combinatorial logic block in the read multiplexer 30, to enable the selection of one of the storage cells corresponding to the selected register in the register file array 20 of FIG. 2. The selection is performed by the read address logic 24 outputting a signal on one of the read line selection lines RE1 through RE4. The selected read line R11, etc., causes the binary state stored on its respective storage cell C11, to be propagated through the combinatorial logic block RM1 of the read multiplexer 30 and output on its output line 31, etc. This operation obtains for each respective column 1, column 2, etc. of the array 20. For example the output of the combinatorial logic block RM2 in column 2 is output on its respective line 32.

Figure 5:
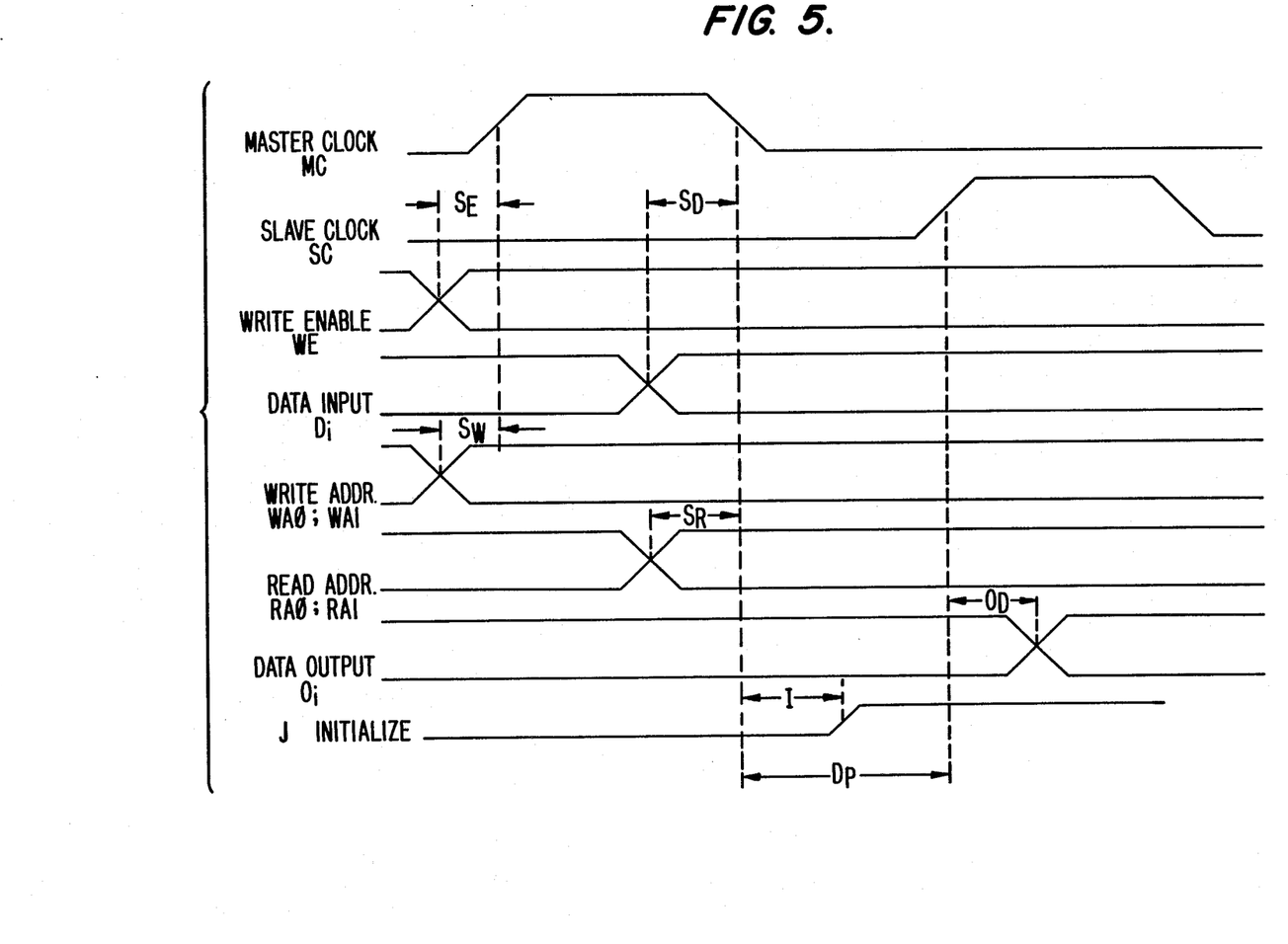
FIG. 5 is a timing diagram illustrating the operation of the register file invention.

The multiplexer 30 propagates the data signals output on the read lines from the array 20 and performs a selection thereof during the delay period DP shown in the timing diagram of FIG. 5. The output latch 40 is a row of LSSD flip-flop latch pairs, L1 and L1* for column 1, L2 and L2* for column 2, etc. L1, L2, etc. are master LSSD latches and L1*, L2*, etc. are slave LSSD latches. Each of the array cells Cij operates as an LSSD master latch. Thus, when an array cell Cij outputs to the output latch 40, it outputs to the slave latch Lj*. The output 31 from the combinatorial logic block RM1 of the read multiplexer 30 is applied to the slave latch L1*. The output 32 of RM2 in column 2 is applied to the slave latch L2*. Each slave latch L1*, L2*, etc., in the output latch 40 is enabled by the slave clock signal SC which occurs after the delay period DP from the occurrence of the master clock signal MC, as is illustrated in the timing diagram of FIG. 5. When the slave clock signal SC occurs, it enables the storage of the binary state applied at the output line 31 from the read multiplexer 30, for example, into the slave latch L1*, for example. As soon as the data output from the read multiplexer 30 is stored in the respective slave flip-flop latches of the output latch 40, the binary state is valid on the respective output nodes O1, O2, etc. of the register file of FIG. 2.

By reference to the timing diagram of FIG. 5, it can be seen that the invention takes advantage of the dead time which occurs between the end of the master clock pulse MC and the beginning of the slave clock pulse SC, to enable the selection of the read line by the read multiplexer 30 and the propagation of the corresponding data signal through the multiplexer to the output latch 40. This use of previously ignored dead time enables a faster overall operation for the register file in conjunction with associated complex logic functions on the same integrated circuit chip.

In addition, both writing operations and independent reading operations can be conducted during the same logic cycle for the register file invention. It should be appreciated that the write address logic 22 has its timing based upon the occurrence of the master clock signal MC, and the selection of a particular row of storage cells in the array 20 is based upon the time of occurrence of the master clock signal MC. The read operation for the circuit is completed when the data from the array is latched in the slave latches of the output latch 40. During the period when the master clock signal is on, the read multiplexer 30 is performing its selection of which particular read lines from the array 20 are to be connected to the output latch 40. When the slave clock signal turns on, the output latch 40 latches the binary state of the selected read line from the read multiplexer 30, thereby providing a valid output signal on the output lines O1, O2, etc. representing the binary state of a separately selected row of storage cells in the array 20. Thus it can be seen that during the same logic cycle which consists of both a master clock pulse and a slave clock pulse, both a write operation to a first register row and a read operation from a second register row can be accomplished. These simultaneous read and write operations are accomplished in a timing sequence which is compatible with the LSSD combinatorial logic connected to both the input of the register file array and to the output of the register file array. In this manner, a completely testable and completely compatible register file can be embodied on the same integrated circuit chip with other complex logic functions embodied in LSSD technology.

Reference is again made to the array 20 in FIG. 2, where the provision for initialization and resetting of each respective storage cell Cij into a predetermined state, is made. The resetting is performed by the provision of a reset FET device Iij in each cell Cij, with each reset device Iij having its gate connected to the reset input J. For example, the cell C11 has the device I11 with its source/drain path connected between node N1 and the positive voltage +V. When the reset signal J is turned on, the node N1 is forced into a positive potential, thereby setting the cell C11 into a predetermined initial state. Reference is also made to the cell C21 shown in FIG. 2, wherein the reset device I21 has its source/drain path connected between the node N1 for the cell C21 and ground potential. When the reset signal J is turned on, the reset device I21 will apply ground potential to the node N1 of the storage cell C21, thereby placing the storage cell C21 in a binary state which is opposite to the initially set binary state for the cell C11, described above. All of the cells Cij in the array 20 can have a reset FET device Iij so that when the reset signal J is turned on to initialize the array, all of the cells Cij in the array will have a predetermined initial binary state. This can be used to advantage in providing a self-testing feature for the register file array, since the contents of each row for the array 20 can be read out to the output latches 40 and then by performing the LSSD scan operation in the output latch 40, to be described later, the operability of each respective cell in each addressed row of the array can be determined. The initialization feature provided by the reset devices Iij in the array 20 provides a further advantage in that the predetermined states for the storage cells can represent an initial set of instructions or other initialization information necessary for start-up operations in the complex logical functions associated with the register file on the same integrated circuit chip.

Figure 6:
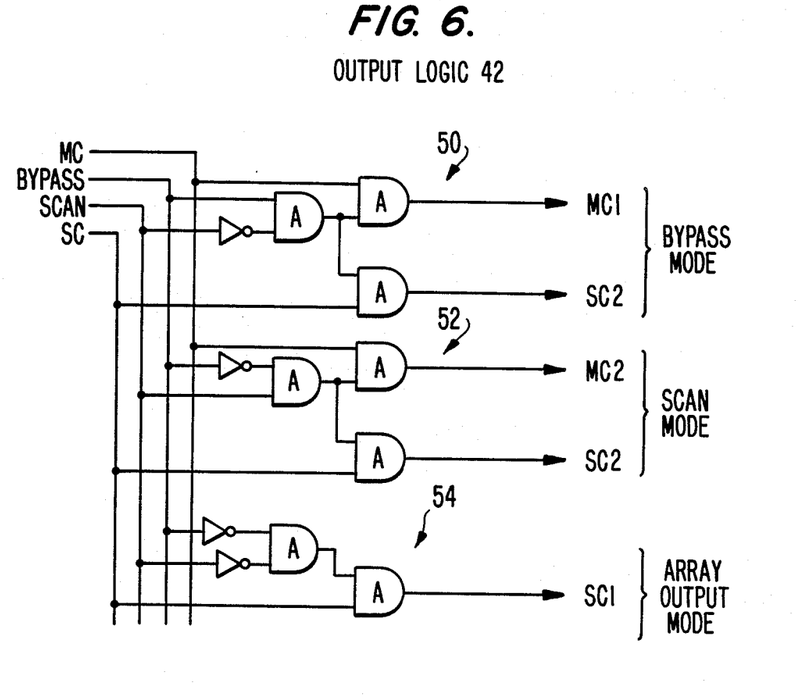
FIG. 6 is a logic diagram of the output logic 42.
Figure 7:
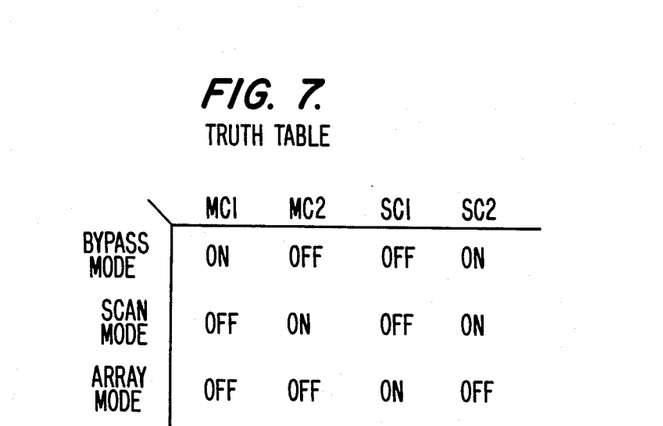
FIG. 7 is a truth table of the output logic 42.

As can be seen in FIG. 1, output logic 42 provides the control over the various functions performed by the output latches 40 in enabling bypass mode of operation, scan testing mode of operation, or normal array output mode of operation to occur. The output logic 42 is shown in detail in FIG. 6 and a truth table of this operation is shown in FIG. 7.

The register file invention finds particular advantage in applications where it is embedded within an environment of complex logic functions which employ the LSSD principle of operation. In LSSD logic circuits, all latches are dual latches having a master latch portion clocked by the master clock MC and a slave latch portion clocked by the slave clock SC. The output of a combinatorial logic block is always applied to the inputs of the master latch during the MC clock interval and then the stored data in the master latch is transferred to the corresponding slave latch during the following SC clock interval. Inputs to the next combinatorial logic block are applied from the slave latch outputs of the LSSD latch to the inputs of the next combinatorial logic block. This principle of operation for LSSD circuits enables the level sensitive scan design testing to be performed, both at the time of manufacture and during functional testing such as when the circuits are initially powered on. Therefore, in order to be fully compatible with an environment of level sensitive scan design complex logic functions, the register file invention must be capable of accepting outputs from slave latches at the beginning of a master clock interval MC, and must be further capable of outputting the results from its array 20 at the end of its slave latch clock interval SC.

This creates an interesting circumstance when there is also provided a bypass mode for the register file, in addition to an array storage and readout mode. In a bypass mode, a data applied at D1, D2 through D8 to the input buffer 16 at the beginning of a master clock interval MC, must be immediately applied to the master latches L1, L2, etc. in the output latches 40. However, in contrast, where data stored in the register file array 20, for example along the rows C11, C12, etc. is to be read out and made available to the inputs of combinatorial logic blocks connected to the output latch 40, the storage cells C11, C12, etc. in the array 20 will necessarily behave as master latches whose outputs are connected to the slave latches L1*, L2*, etc. in the output latch 40, in order to provide outputs from the output latches 40 to the inputs of the connected combinatorial logic blocks, which are valid at the beginning of the next master clock interval MC. This is accomplished by turning on the bypass enable input to the output logic 42 so that the logic elements 50 shown in FIG. 6 connect the master clock MC to the clock line MC1 and the slave clock SC to the clock line SC2. By inspection of FIG. 2, it can be seen that with MC1 on, the transfer devices T3 and T4 will be conducting, thereby allowing the bit lines BL1 and BL1* to set the binary state of the master latch L1. Since the MC2 line will be off, the devices T9 and T10 will not be conducting and therefore no information will be propagated from one column to the next, thereby avoiding any undesired LSSD scan function at this time. With the line SC2 being on, when the slave clock SC turns on, the transfer devices T5 and T6 will be conducting, thereby transferring the states at the nodes N3 and N4 in this master latch L1 to the corresponding nodes N5 and N6 in the slave latch L1*. Thus, at the end of the slave clock interval SC, the binary state of the node N5 for the slave latch L1* will be valid and is applied through an inverter to the output O1 of the output latch 40. In this manner, the data applied at D1 through D8 to the data input register of the register file during the master clock interval MC, will be valid and available at the outputs O1 though O8 of the output latch 40 at the end of the slave clock interval SC. This is how the bypass mode is accomplished and the LSSD timing preserved.

The LSSD scan mode should occur at times during which the bypass mode is excluded and the array output mode is excluded. In the LSSD scan mode, the output latch 40 is written into either by an external test data line E, or by reading a particular row of the array 20. Then, the master and slave latches Li and Li* are connected into a serial shift register chain and the stored data therein is propagated along that chain to a connected LSSD scan string for testing purposes. This is achieved by turning on the scan enable line to the output logic 42 so that the logic elements 52 shown in FIG. 6 connect the master clock MC to the MC2 line and the slave clock SC to the SC2 line. By inspecting FIG. 2, it can be seen that when the MC2 line carries the master clock waveform MC, the FET devices T9 and T10 of the master latch L1 are conductive. Thus, if the test data is applied at the external test data input E, the true value of the test data is applied at the gate of the FET device T11 and the complement of the test data is applied at the gate of the FET device T12. Since the devices T9 and T10 are on, the data applied on the external test data line E will render conductive one of the devices T11 and T12 and will render nonconductive the other device, so that the state of the master latch L1 is set. Then, since the SC2 line is connected to the slave clock SC, during the slave clock interval, the devices T5 and T6 of the slave latch L1* are conductive, thereby enabling the transfer of the binary state of the master latch L1, into the slave latch L1*. Since the MC2 line is connected to the master clock waveform, during the subsequent interval, the binary state stored on the slave latch L1*, which is applied to the gates of the transistors T11 and T12' of the master latch L2, will be effective and will serve to set the binary state of the master latch L2, thereby propagating the binary state of the test data initially written into the master latch L1, subsequently into the master latch L2. At the same time, a new binary state is written into the master latch L1, thereby illustrating the propagation of the externally applied test data on the line E through a concatenated sequence of master and slave latches L1, L1*, L2, L2*, etc.

An alternate manner for applying test data to the output latches 40 for LSSD scan propagation, is to transfer the contents of one of the rows of storage cells Cij in the array 20, directly into the corresponding slave latches L1*, L2*, etc. This is performed as follows. Define a logic cycle as the interval necessary to perform a master clock interval MC and a following slave clock interval SC. During a first logic cycle, the J reset line is turned on, thereby initializing the binary state of all of the storage cells Cij in the array 20. For example, the cell C11 will have its node N1 forced to a positive potential representing a binary "1." Then, during the next logic cycle, a read operation is to take place, where the read address logic 24 has the address RA0, RA1 applied thereto and, when the master clock MC turns on, the corresponding read line R11 connects the node N1 of the storage cell C11 to the output line 31 for the read multiplexer element RM1. During this normal array output mode of operation, both the bypass input line and the scan input line are off, and therefore the output logic 42 has the logic elements 54 shown in FIG. 6 connect the SC1 line to the slave clock SC. Since the output line 31 from the read multiplexer RM1 is connected to the slave latch L1*, when the SC1 line turns on, it renders conductive the devices T7 and T8, thereby setting the binary state of the slave latch L1*. The slave latches L1*, L2*, ... L8* are now set with the binary states of the storage cells C11, C12, ... C18 in the selected row of the array 20. Next, the scan enable line is turned on to the output logic 42, thereby causing the logic 52 in FIG. 6 to connect the MC2 line to the master clock MC and the SC2 line to the slave clock SC. Then in the next (third occurring) logic cycle, when the master clock MC turns on, the MC2 line is enabled, thereby causing the binary state of the slave latch L1* to be transferred to the master latch L2. When the next slave clock interval SC turns on, the line SC2 is turned on, thereby causing the binary state stored in the master latch L2 to be transferred to the slave latch L2*. In this manner, the predetermined binary state set into the row of storage cells in the array 20 as test information, is transferred to the output latches 40 and is scanned out in the LSSD testing mode, to enable the self-testing of the storage cells in the array 20.

Finally, in the array output mode, as was previously described, both the bypass input and the scan input to the output logic 42 are turned off. Thus, the output logic 42 has the logic elements 54 in FIG. 6 connect the SC1 line to the slave clock SC. Thus, during the master clock interval MC, when a particular row of storage cells Cij is read out on the corresponding readout lines Rij, the outputs of the storage cells in the selected row are written into the corresponding slave latches L1*, L2*, etc. through the transfer devices T7 and T8 which are rendered conductive by the SC1 line during the slave clock interval SC. The binary state of the slave latches L1*, L2*, etc. are then valid at the outputs O1, O2, etc. of the output latch 40.

Figure 8:
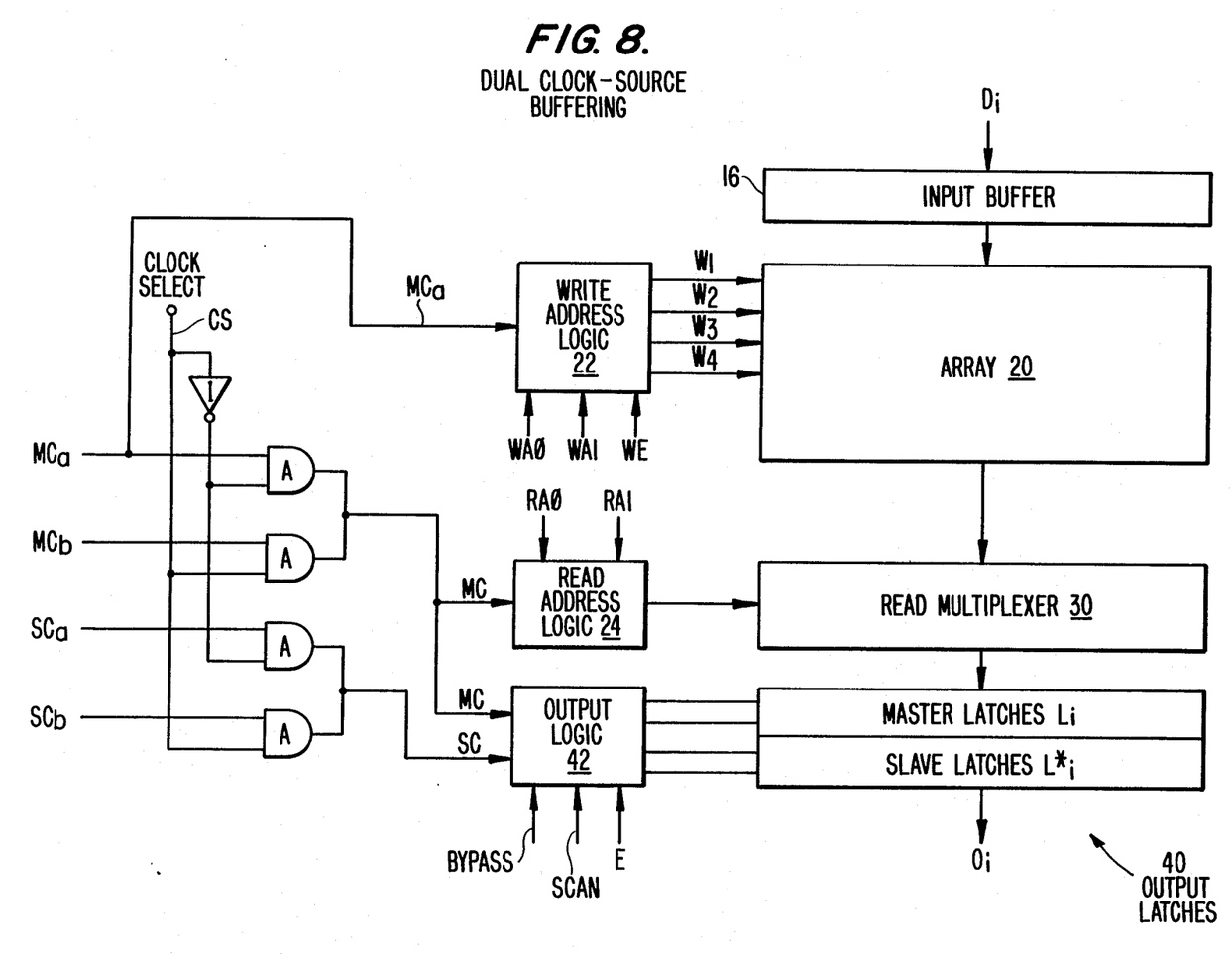
FIGS. 8 and 9 illustrate the dual clock-source buffering feature.
Figure 9:
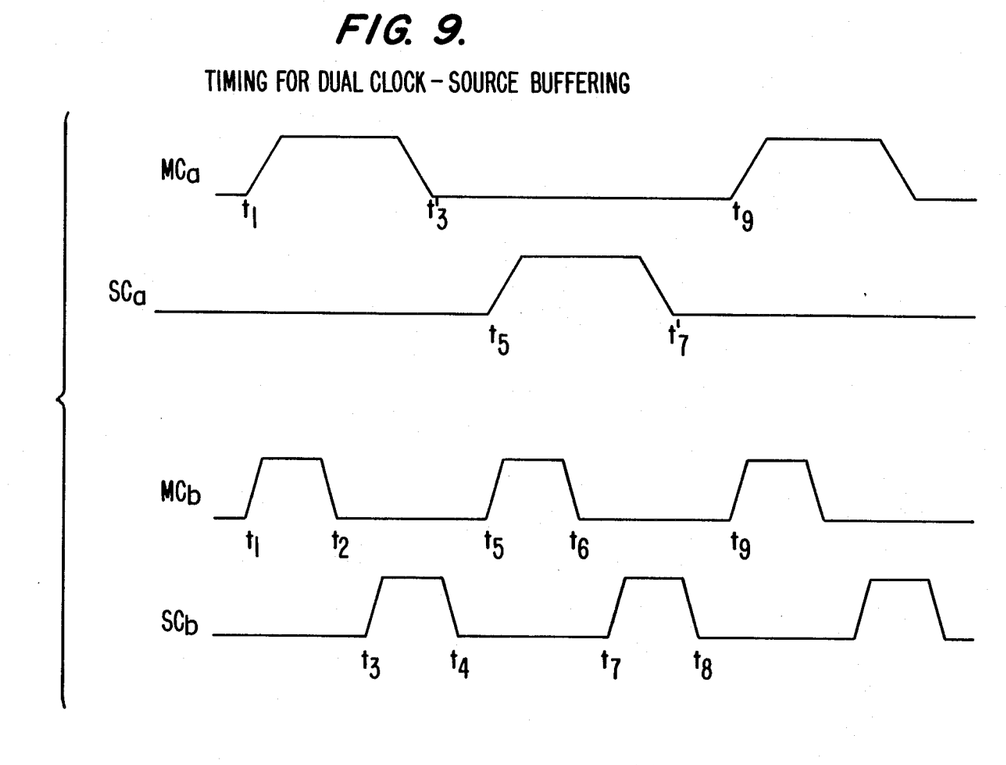

FIGS. 8 and 9 illustrate the dual clock-source buffering feature of the register file invention. FIG. 9 is a timing diagram which illustrates two sources for the clock timing. A first source labeled "a" is a source for a first master clock MCa and slave clock SCa pair of waveforms and a second source "b" is a source for a second pair of master MCb and slave SCb waveforms, as shown in the figure. The "a" source can be for example a data bus having a first clocking phase and frequency and the second "b" source for clocking can be, for example, a connected microprocessor. In such an example, the register file invention would serve as a speed matching buffer to enable the communication of data between the microprocessor and the connected bus in spite of their differences in phase and frequency of timing. Further studying the timing diagram of FIG. 9, it can be seen that the master clock MCa has a periodic repetition rate which is one-half the periodic repetition rate for the master clock MCb. Further it can be seen that the slave clock SCa is a non-overlapping clock waveform with the master clock MCa, having the same repetition rate. Similarly, it can be seen that the slave clock SCb is a non-overlapping waveform with the master clock MCb, and it has the same repetition rate as MCb. To further illustrate the relative timing of the "a" clock source and the "b" clock source, MCa is shown to start at the time t1 and MCb is shown to start at the time t1. However MCb is shown to fall at the time t2, which is twice as fast as the fall time for MCa which is t'3. MCa does not rise again until the later time t9, at which time it can be seen that MCb starts to rise for the third time in FIG. 9. The slave clock SCa rises at t5 and falls at t'7 whereas the slave clock SCb rises at t3, falls at t4 and then rises at t7 and falls at t8, twice as fast as does SCa.

The dual clock-source buffering feature is illustrated in FIG. 8, wherein the input buffer 16, the array 20, the read multiplexer 30, the output latches 40, the output logic 42, the read address logic 24 and the write address logic 22 are the same as has been described previously with respect to FIG. 1. The first source "a" timing MCa and SCa are shown input to the logic of FIG. 8 and the second source "b" of the master clock MCb and the slave clock SCb are shown input to the logic of FIG. 8. The "a" source master clock MCa is applied as the master clock input to the write address logic 22 substituting for the "MC" input shown in FIG. 1. The clock select CS input enables the selection of either the "a" source of clocking MCa and SCa or alternately the selection of the "b" clocking MCb and SCb to the output logic 42, as is shown in FIG. 8. Clock select logic CS also enables th selective application of the "a source" or alternately the "b source" master clock MCa or MCb to the read address logic 24 as shown in FIG. 8.

When the register file circuit of FIG. 8 is to be operated with a single clock source, the clock select logic CS is set to apply only the "a" clock source MCa and SCa to the balance of the circuit shown in FIG. 8, this being the mode of operation which has been previously described with respect to FIGS. 1-7.

In the dual clock-source buffering mode, the clock select CS is set to apply the "b" source master clock MCb to the MC input of the read address logic 24 and the MC input of the output logic 42 and to apply the "b" source slave clock SCb to the SC input of the output logic 42. In this mode, the data applied at the input buffer 16 and written into the array 20 under the control of the write address logic 22 is timed to occur with the "a" clock source MCa. This for example can correspond to the writing of information received from a bus into the array 20, at a relatively slow bus rate. The data written into the array 20 at the "a" clock source rate shown in FIG. 9, can be read out to a faster microprocessor using a faster "b" clock rate. To achieve this, the "b" clock source master clock MCb is applied to the read address logic 24 and to the output logic 42 and the faster slave clock SCb is applied to the output logic 42. The read operation then proceeds in the same manner as has been previously described with respect to FIGS. 1-7. The data rate at the output Oi from the output latches 40 is available at the slave latches Li* at the higher speed "b" clock source frequency, as shown in FIG. 9. In this manner, differences in phase and frequency between the writing into the array 20 and the reading out of the array 20 can be accommodated by the dual clock-source buffering feature shown in FIG. 8.

The bypass mode of operation and the LSSD scan mode of operation described above in connection with FIGS. 1-7, also can be carried out in the dual clock-source buffering embodiment of FIG. 8, at either the "a" source speed or the "b" source speed, depending upon the setting of the clock select line CS. In some applications, it may be necessary to include logic to detect for the identity of the write address WA0, WA1 and the read address RA0, RA1, so as to avoid writing into a row and reading out of a row at different rates or different phases. An example of such arbitration would be to require that write operations will always take precedence over read operations. A simple comparator connected between corresponding write address lines and read address lines will identify the occurrence of the simultaneous application of the same value read address and write address and by providing a disabling line output from that comparator to the read address logic 24, the read address logic can be disabled in preference of the write address logic 22, for example. Other forms of arbitration can be chosen, depending upon the particular application. The feature of when it is desired to initialize or reset the array 20 with the predetermined bit pattern stored in the devices Iij, by applying a pulse on the J line, all that is necessary is to momentarily disable the write address logic 22, so that the reset bits are effectively written into the respective storage cells of the array 20 without interference by the application of an address from the write address logic 22.

Although a specific embodiment of the invention has been disclosed, it will be understood by those having skill in the art that minor changes can be made to that specific embodiment without departing from the spirit and the scope of the invention.

What is claimed is:

1. An improved register file, comprising:

a $2^{nth}$ by M array of storage cells arranged in M columns, each column having a true bit line and a complement bit line;

each said storage cell including a flip-flop cell having two storage nodes, a first node connected through a first transfer gate to said true bit line and a second node connected through a second transfer gate to said complement bit line, said first and second transfer gates having control electrodes connected to a write signal, said true and complement bit lines in each respective one of said M columns connected to a respective one out of M data input lines;

each said cell including a respective read line connected to said first node thereof;

a write decoder having an input connected to a master clock signal and having an N bit write address input, and having $2^{nth}$ output lines respectively connected to said control electrodes of said transfer gates of M ones of said storage cells in each cell occupying respective ones of said M columns in said array, said $2^{nth}$ lines transferring said write signal to said storage cells, for selecting M ones of said storage cells in a row for writing said M bites of input data therein;

a read address latch having an input connected to said master clock signal and having a read address input of N bits;

a multiplexer having $2^{nth}$ times M inputs from said array as said read output lines therefrom, and having N bits input from said read address latch for selecting M out of said $2^{nth}$ times M read output lines and outputting the corresponding M data signals on M output lines;

a first M bit output storage cell array, each storage cell thereof having an array mode data input, an array mode data output and a first slave clock signal input which is operative during an array mode, and further having a test mode data input, a test mode data output and a second slave clock signal input which is operative during a test mode and a bypass mode, said array mode data input being selectively connected to a respective one of said M output lines from said multiplexer and said array mode data output being coupled to a register file output terminal in response to a slave clock signal being input to said first slave clock signal input, said slave clock signal occurring after a delay period from the occurrence of said master clock signal, said multiplexer propagating said data signals output on said read lines from said $2^{nth}$ by M array and performing said selection thereof, said first M bit output storage cell array storing data from said array as selected by said multiplexer on said M output lines therefrom, in said array mode;

a second M bit output storage cell array, each storage cell thereof having a bypass mode data input, a bypass mode data output and a first master clock signal input which is operative during said bypass mode, and further having a test mode data input and a second master clock signal input which is operative during said test mode, said bypass mode data input being selectively connected to a respective one of said M data input lines connected to said input to said $2^{nth}$ by M array of storage cells in response to said master clock signal being input to said first master clock signal input, and said bypass mode data output being selectively connected to said test mode data input of a corresponding one of said storage cells in said first M bit output storage cell array in response to said slave clock signal being input to said second slave clock signal input, for storing data from said M data input lines, bypassing said $2^{nth}$ by M array, in said bypass mode;

a first one of said storage cells in said second M bit output storage cell array, having its test input connected to a serial test data input, and remaining ones of said storage cells in said second storage cell array having said test mode data input thereof selectively connected to said test mode data output of a respective one of said storage cells in said first storage cell array in response to said master clock signal being input to said second master clock signal input and in response to said slave clock signal being input to said second slave clock signal input, forming a concatenated sequence of storage cells alternately drawn from said storage cells of said first M bit output storage cell array and from said storage cells of said second M bit output storage cell array, for serially scanning test data in from said serial input through said first and second M bit output storage cell arrays, in said test mode.

2. The improved register file of claim 1, which further comprises:

each said cell in said $2^{nth}$ by M array of storage cells including a reset transistor which is selectively connected between said first storage node and either a first binary potential or a second binary potential value;

whereby said $2^{nth}$ by M array of storage cells can be reset into a predetermined set of states.

3. An improved register file, comprising:

a $2^{nth}$ by M array of storage cells arranged in M columns, each column having a true bit line and a complement bit line;

each said storage cell including a flip-flop cell having two storage nodes, a first node connected through a first transfer gate to said true bit line and a second node connected through a second transfer gate to said complement bit line, said first and second transfer gates having control electrodes connected to a write signal, said true and complement bit lines in each respective one of said M columns connected to a respective one out of M data input lines;

each said cell including a respective read line connected to said first node thereof;

a write decoder having an input connected to a first master clock signal and having an N bit write address input, and having $2^{nth}$ output lines respectively connected to said control electrodes of said transfer gates of M ones of said storage cells in each cell occupying respective ones of said M columns in said array, said $2^{nth}$ lines transferring said write signal to said storage cells, for selecting M ones of said storage cells in a row for writing said M bits of input data therein;

a read address latch having an input connected to a second master clock signal and having a read address input of N bits;

a multiplexer having $2^{nth}$ times M inputs from said array as said read output lines therefrom, and having N bits input from said read address latch for selecting M out of said $2^{nth}$ times M read output lines and outputting the corresponding M data signals on M output lines;

an M bit output storage cell array, each storage cell thereof enabled by a slave clock signal which occurs after a delay period from the occurrence of said second master clock signal, for storing data from said array as selected by said multiplexer on said M output lines therefrom;

said multiplexer propagating said data signals output on said read lines from said array and performing said selection thereof during said delay period;

whereby said register file can be written into at a first clock rate and read from in a second clock rate.

4. The improved register file of claim 3, which further comprises:

said output storage cells each comprising a master/slave storage cell, with the master storage cell thereof being selectively connected to either said first or said second master clock signal and to said M data input lines input to said $2^{nth}$ by M array of storage cells, whereby said $2^{nth}$ by M array of storage cells and said multiplexer can be circumvented at either said first or said second clock rates.

* * * * *